(12) United States Patent
Weimer et al.

(10) Patent No.: US 8,058,140 B2
(45) Date of Patent: Nov. 15, 2011

(54) THICKENED SIDEWALL DIELECTRIC FOR MEMORY CELL

(75) Inventors: Ron Weimer, Boise, ID (US); Kyu Min, San Jose, CA (US); Tom Graettinger, Boise, ID (US); Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/757,869

(22) Filed: Apr. 9, 2010

(65) Prior Publication Data
US 2010/0197131 A1 Aug. 5, 2010

Related U.S. Application Data

(62) Division of application No. 11/847,183, filed on Aug. 29, 2007, now Pat. No. 7,705,389.

(51) Int. Cl.
*H01L 21/76* (2006.01)
(52) U.S. Cl. ......... 438/430; 438/261; 438/435; 438/259
(58) Field of Classification Search .................. 438/259, 438/261, 264, 266, 424, 430, 435
See application file for complete search history.

(56) References Cited

U.S. PATENT DOCUMENTS

| | | |
|---|---|---|
| 5,714,766 A | 2/1998 | Chen et al. |
| 6,054,350 A | 4/2000 | Hsieh et al. |
| 6,153,472 A | 11/2000 | Ding et al. |
| 6,576,558 B1 | 6/2003 | Lin et al. |
| 6,649,489 B1 * | 11/2003 | Chang et al. .......... 438/424 |
| 6,649,968 B2 | 11/2003 | Wolstenholme |
| 6,677,639 B2 | 1/2004 | Lee et al. |
| 6,686,243 B2 | 2/2004 | Jang |
| 6,869,849 B2 | 3/2005 | Kanamori |
| 7,087,950 B2 | 8/2006 | Willer et al. |
| 7,626,230 B2 | 12/2009 | Joo et al. |

(Continued)

FOREIGN PATENT DOCUMENTS
KR 10-0729364 B1 6/2007

OTHER PUBLICATIONS

International Search Report and Written Opinion PCT Appl. No. PCT/US2008/073693 mailed Mar. 20, 2009.

(Continued)

*Primary Examiner* — Victor A Mandala
*Assistant Examiner* — Scott Stowe
(74) *Attorney, Agent, or Firm* — Knobbe Martens Olson & Bear LLP

(57) ABSTRACT

Methods and devices are disclosed, such as those involving memory cell devices with improved charge retention characteristics. In one or more embodiments, a memory cell is provided having an active area defined by sidewalls of neighboring trenches. A layer of dielectric material is blanket deposited over the memory cell, and etched to form spacers on sidewalls of the active area. Dielectric material is formed over the active area, a charge trapping structure is formed over the dielectric material over the active area, and a control gate is formed over the charge trapping structure. In some embodiments, the charge trapping structure includes nanodots. In some embodiments, the width of the spacers is between about 130% and about 170% of the thickness of the dielectric material separating the charge trapping material and an upper surface of the active area.

10 Claims, 4 Drawing Sheets

U.S. PATENT DOCUMENTS

| | | | |
|---|---|---|---|
| 2003/0141535 A1* | 7/2003 | Jang | 257/314 |
| 2006/0043457 A1 | 3/2006 | Baik | |
| 2007/0126054 A1 | 6/2007 | Jung | |
| 2007/0210368 A1* | 9/2007 | Cho et al. | 257/314 |
| 2007/0267681 A1 | 11/2007 | Joo et al. | |

OTHER PUBLICATIONS

International Preliminary Report on Patentability, Appl. No. PCT/US2008/073693, mailed Mar. 11, 2010.

* cited by examiner

THICKENED SIDEWALL DIELECTRIC FOR MEMORY CELL

CROSS-REFERENCE TO RELATED APPLICATION

This application is a divisional application of U.S. application Ser. No. 11/847,183, filed Aug. 29, 2007, the entirety of which is incorporated by reference herein.

BACKGROUND OF THE INVENTION

1. Field of the Invention

Embodiments of the invention relate to memory devices, and more particularly to memory devices with memory cells having sidewall dielectrics.

2. Description of the Related Art

A wide variety of computer memory devices are now available. One type of memory device that has become popular is flash memory. Flash memory devices advantageously are nonvolatile and do not require capacitors as storage devices. Because fewer components are required in flash memories, a higher density of cells may be formed.

A flash memory cell typically includes a charge trapping structure (sometimes also referred to as a charge retention structure, a charge storage structure, or a storage area, for example) and a control gate. The control gate is configured to selectively inject and remove the charge in the charge trapping structure. The control gate is usually positioned adjacent to the charge trapping structure but separated from the charge trapping structure by a dielectric. When a voltage is applied to the control gate, charge may tunnel through the dielectric and be stored in the charge trapping structure. The state of charge stored in the charge trapping structure is indicative of the logical state of the flash memory cell.

There is a continual demand to produce flash memories with memory cells that are smaller in size to allow for higher memory capacities. However, as the dimensions of the flash memory cells decrease, new problems are introduced and old problems are exacerbated. For example, poor charge trapping characteristics may cause a flash memory cell to indicate an incorrect logical state. Thus, there is a need for flash memories and methods of forming those memories that have, for example, good reliability in indicating a desired logic state.

BRIEF DESCRIPTION OF THE DRAWINGS

The appended drawings are schematic, not necessarily drawn to scale, and are meant to illustrate and not to limit embodiments of the invention.

DETAILED DESCRIPTION

Figures 1A, 1B:
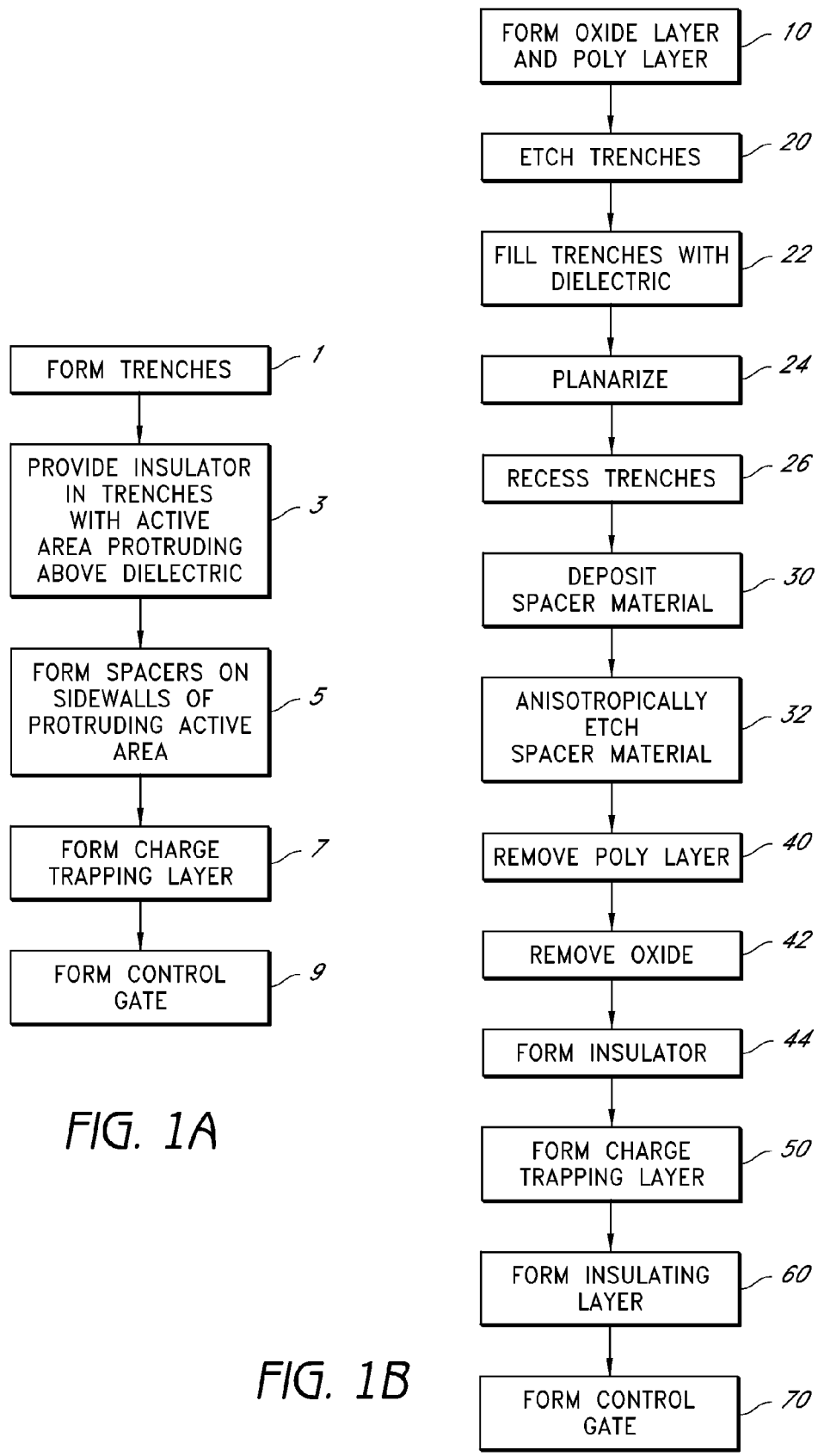
FIG. 1A is a flow chart illustrating a process in accordance with one or more embodiments of the present invention.
FIG. 1B is another flow chart illustrating a process in accordance with one or more embodiments of the present invention.

As noted above, a flash memory cell works by using a control gate to inject and remove charge within the memory cell. The state of charge stored in the device defines the logical state of the memory cell. Thus, typical flash memory cells have the ability to retain a charge and to remove that charge, as desired, to allow that cell to be written to, thereby allowing accurate reading of the information stored on that cell. It will be appreciated that the logical state of a memory cell may be read incorrectly if a memory cell retains a charge even after a write operation is performed to remove that charge.

It has been found that undesired charge retention may be problematic in memory cells having charge trapping structures at the sides of active areas. The active area of a memory cell may be provided, for example, adjacent a charge trapping structure with the path of charge carriers through the active area determined by the presence or absence of change in the charge trapping structure. Charge from the active areas may leak into the charge trapping structures. This charge may be difficult to remove. Without being limited by theory, the location of the control gate over the active area and the distance of the control gate from charge trapping structures at the sides of the active areas can make removal of charge from those charge trapping structures difficult. Charge trapping structures can include a single continuous layer of material for storing charge or discontinuous regions of material which form a plurality of discrete charge trapping sites, such as nanodots. In memory cells having discrete charge trapping sites, which require the active removal of charge from each discrete charge retention site, problems with undesired charge retention may be exacerbated. As a result, it may be difficult to remove charge from charge retention sites spaced away from a control gate. As memory devices become smaller, dielectric layers between active areas and charge trapping structures may become thinner, potentially resulting in greater leakage. Further, because the charge trapping structures are correspondingly smaller, defects that would have resulted in an acceptable amount of leakage in a larger scale device may be unacceptable for newer generation memory devices.

Embodiments described herein provide systems and methods of forming memory cell devices with improved charge retention characteristics. In one or more embodiments, a memory cell is provided having an active area defined by sidewalls of neighboring trenches, wherein trenches are volumes defined by sidewalls and a floor formed of one or more materials different from the material occupying the volume. It will be appreciated that trenches may be "empty" and not occupied by any solid phase material. Dielectric material is blanket deposited over the memory cell, and etched to form spacers on sidewalls of the active area. A dielectric is formed over the active area, and a charge trapping layer is formed over the dielectric material and at the sides of the spacers. In some embodiments, charge trapping structures include a charge trapping layer which can include embedded discrete charge trapping sites, such as nanodots. Advantageously, the spacers may form a thicker dielectric structure at the sidewalls of the active area than the dielectric material directly overlying the active area. In one or more embodiments of the invention, the spacers are believed to advantageously prevent charge leakage from the active area into the charge trapping layer at the sides of the active area, thereby preventing undesired charge retention in parts of the charge trapping layer at the sides of the active area.

Reference will now be made to the figures, in which like numerals refer to like parts throughout.

FIG. 1A generally illustrates a sequence of process steps according to some embodiments of the invention. In step 1 of FIG. 1A, trenches are formed in a substrate, such as by etching into the substrate or by forming material over a substrate in a pattern that defines a trench. As used herein, "forming" a structure includes performing steps to make the structure or providing the structure already premade. In step 3, dielectric material is formed in the trenches such that the dielectric only partially fills the trenches to allow an active area of the substrate between the trenches to protrude above the dielectric material. In step 5, spacers are formed on sidewalls of the portions of the active area that protrude above the fill material. In step 7, a charge trapping layer is formed over the active area and at the sides of the spacers. In step 9, a control gate is formed over the charge trapping layer.

FIGS. 1B-9 show schematically a detailed sequence of process steps according to some embodiments of the invention. In step 10, a substrate 100 is provided and an oxide layer 110 and a polysilicon layer 112 are formed thereover.

Figure 2:
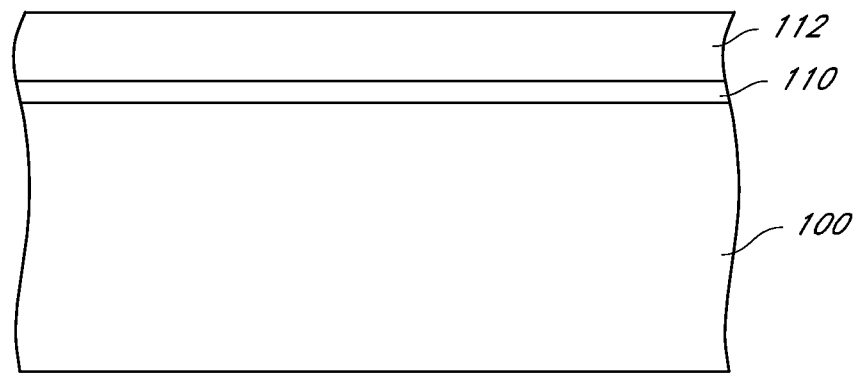
FIG. 2 illustrates a cross-sectional side view of a partially formed memory cell in accordance with one or more embodiments of the present invention.

FIG. 2 illustrates a cross-sectional view of a partially formed memory cell after step 10 has been carried out. The substrate 100 may include one or more of a wide variety of suitable workpieces for semiconductor processing. In some embodiments, the substrate 100 includes doped silicon platforms in which the level of dopant varies within the substrate 100, which can have advantages for forming flash memory devices. As will be appreciated from the description below, layers 110, 112 are useful to protect the substrate 100 and in carrying out later steps in the illustrated process. While the illustrated process uses the oxide layer 110 as a sacrificial layer, in other embodiments the oxide layer 110 may form part of the final memory cell structure.

Figure 3:
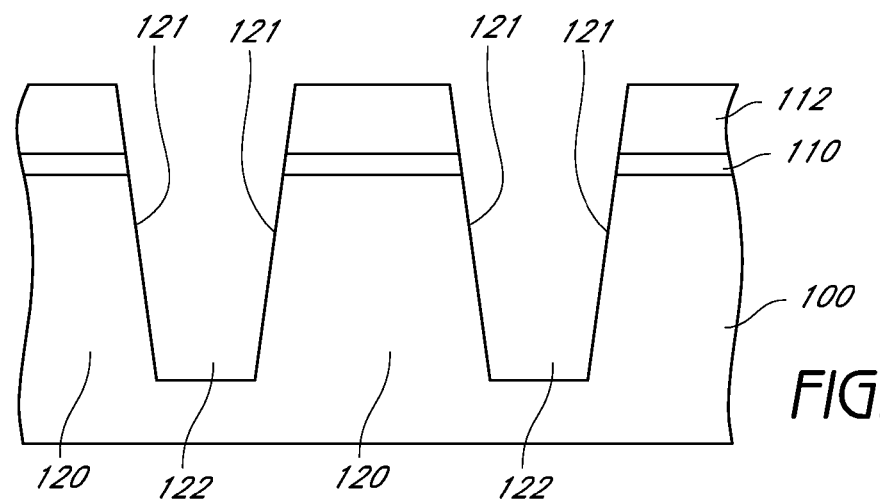
FIG. 3 illustrates a cross-sectional side view of the partially formed memory cell of FIG. 2 after trenches have been formed in accordance with one or more embodiments of the present invention.

Referring to FIGS. 1B and 3, FIG. 3 illustrates a cross-sectional view of the memory cell after step 20 of FIG. 1B has been carried out. In step 20, trenches 122 are etched in the substrate 100. Step 20 may be carried out in accordance with well-known processes for etching trenches in substrates, such as by forming a masking layer and etching through the masking layer. In embodiments in which a masking layer is used to form the trenches 122, the polysilicon layer 112 may be useful as an etch stop layer for the removal of the masking layer. In some embodiments, the trenches 122 may have a depth of between about 1500 Å and about 2500 Å, and in some other embodiments, a depth of between about 1800 Å and about 2200 Å. In some embodiments, the trenches 122 may have a width, at their tops, of between about 300 Å and about 450 Å, and in some other embodiments, the width is of between about 325 Å and about 425 Å. Sidewalls 121 of the trenches 122 define an active area 120 in an inter-trench region of the substrate 100.

Figure 4:
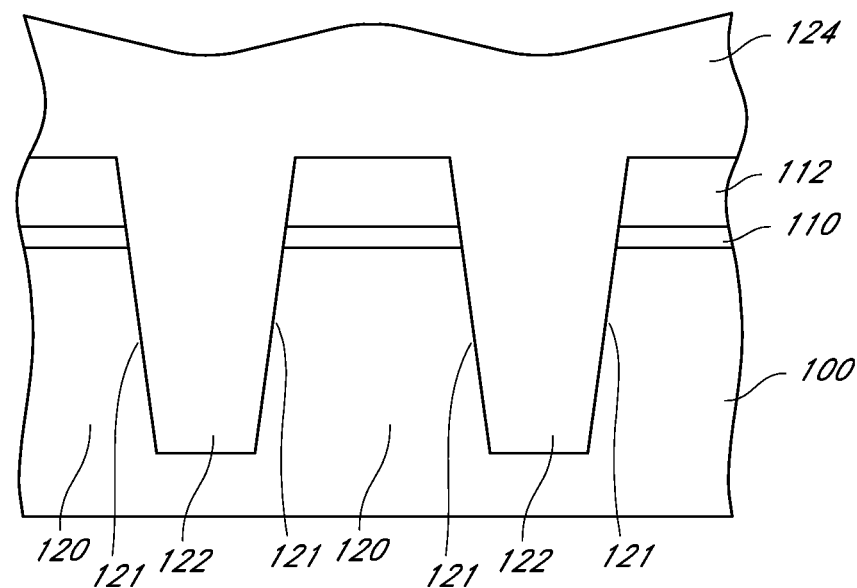
FIG. 4 illustrates a cross-sectional side view of the partially formed memory cell of FIG. 3 after trenches have been filled in accordance with one or more embodiments of the present invention.

FIG. 4 illustrates a cross-sectional view of the memory cell after step 22 of FIG. 1B has been carried out. In step 22, the trenches 122 are filled with a filler 124. The filler 124 may comprise a dielectric material, such as an oxide, to form shallow trench isolation structures so that the active areas 120 are electrically insulated from charge in the trenches 122. In the illustrated embodiment, the filler 124 overfills the trenches 122. In some embodiments, step 24 of filling the trenches 122 includes carrying out plasma-enhanced oxidation.

Figure 5:
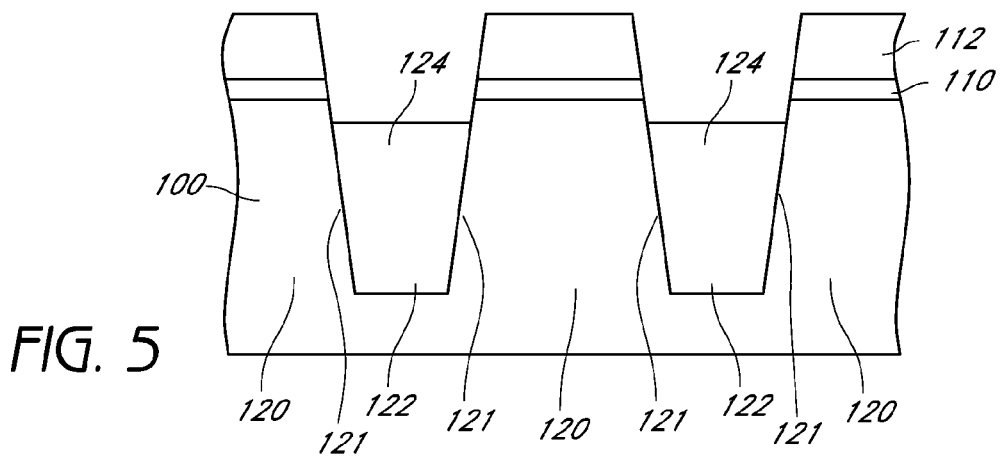
FIG. 5 illustrates a cross-sectional side view of the partially formed memory cell of FIG. 4 after planarization and recessing of the filler in accordance with one or more embodiments of the present invention.

Following step 22, in step 24, the trenches 122 are planarized, and in step 26, the trenches 122 are recessed. FIG. 5 illustrates a cross-sectional view of the memory cell after the steps 24 and 26 have been carried out. Step 24 of planarizing may be carried out by using known processes such as chemical/mechanical polishing (CMP). While known processes for planarization such as CMP result in a generally planar surface, those processes may also produce slight recesses, particularly at a boundary between two different types of material. Thus, after planarizing the filler 124 to a level approximately coplanar with the top surface of the polysilicon layer 112, the polysilicon layer 112 may be recessed with respect to the filler 124, or the filler 124 may be recessed with respect to the polysilicon layer 112. While these slight imperfections in planarization processes may have only negligible effects in older generation, larger scale memory cells, the effects of these imperfections are exaggerated as devices become smaller. For example, if the polysilicon layer 112 is recessed with respect to the filler 124 and this recessing is not remedied in a later step, the filler 124 would be elevated with respect to the active area in the final structure. This may result in the trenches 122 "pinching" or reducing the effective width of the structures above the active area, such as the control gate and the charge trapping layer. Pinching may occur because material deposited into the volume over the recessed polysilicon can preferentially deposit on sidewalls of the recess, thereby closing off the volume. For example, deposition of dielectric material can pinch off access to the recess, thus preventing the control gate and the charge trapping layer from being formed sufficiently close to the upper surface of the active area for reliable electrical performance. Such a structure would hinder the communication of the upper layers with the active area, and therefore negatively impact the performance of the memory cell.

Accordingly, the filler 124 can be recessed in the trenches 122, such as in order to mitigate or eliminate this pinching effect. The recessing step 26 may be carried out by selectively etching the filler 124 with respect to the other materials of the memory cell, such as the polysilicon layer 112 and the substrate 100. In some embodiments, the trenches 122 may be recessed from an upper surface of the active area 120 by between about 20 Å and about 300 Å, and between about 50 Å and about 150 Å in some embodiments.

Figure 6:
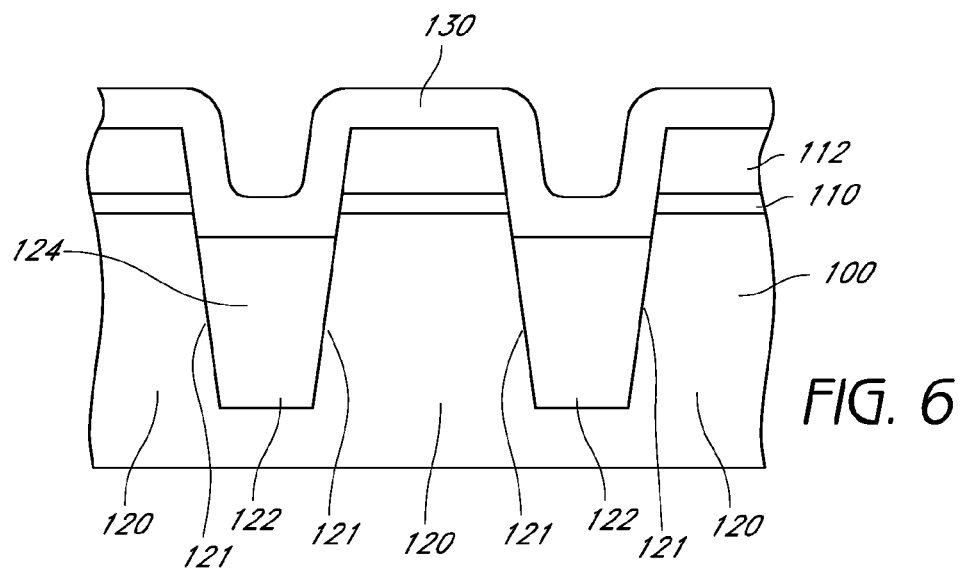
FIG. 6 illustrates a cross-sectional side view of the partially formed memory cell of FIG. 5 after depositing a spacer material in accordance with one or more embodiments of the present invention.
Figure 7:
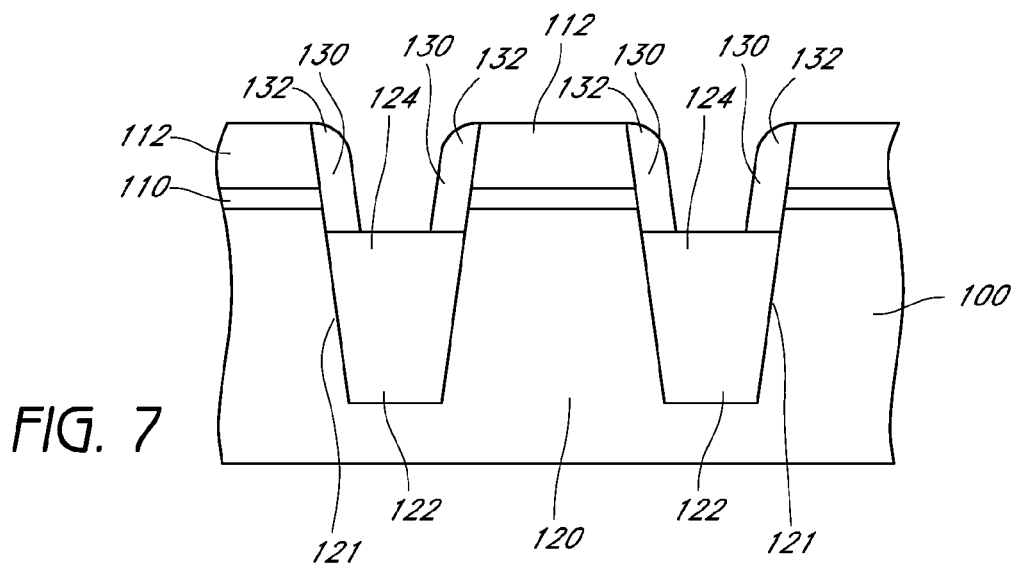
FIG. 7 illustrates a cross-sectional side view of the partially formed memory cell of FIG. 6 after performing a spacer etch in accordance with one or more embodiments of the present invention.

Following step 26, in step 34, a spacer material 130 is deposited on the substrate 100. FIG. 6 illustrates a cross-sectional view of the memory cell after step 30 has been carried out. In the illustrated embodiment, the spacer material 130 is blanket deposited such as to provide a relatively uniform thickness over the upper surfaces of the active areas 120 and the trenches 122, as well as upper portions of the sidewalls 121 of the trenches 122 (i.e., those portions of the sidewalls 121 that have become exposed by virtue of the recessing step 26). The spacer material 130 may include dielectric material, such as silicon oxide. The spacer material 130 can be formed using silicon precursors, such as silane or dichlorosilane, in combination with an oxidant, such as nitrous oxide. Step 30 for depositing the spacer material 130 may comprise performing atomic layer deposition. In some other embodiments, the spacer material 130 may be deposited by chemical vapor deposition (CVD). Silicon precursors for CVD may include tetraethylorthosilicate (TEOS) or silane, With continued reference to FIG. 1, following step 30, a spacer etch is performed in step 32. The spacer etch may include anisotropically (e.g., directionally) etching the spacer material 130. FIG. 7 illustrates a cross-sectional view of the memory cell after step 32 has been carried out. An anisotropic etch removes spacer material 130 from horizontal surfaces at a greater rate than from vertical surfaces. Accordingly, after the anisotropic etch, spacer material may be reduced or eliminated above the active area and/or interior regions in the trenches. In the embodiment illustrated at FIG. 6, spacer material 130 has been anisotropically etched from horizontal surfaces to form spacers 132 at the sidewalls 121 of the active areas 120. The thickness of the layer of spacer material 130 corresponds roughly to the width of the spacers 132. Once the device has been fully formed, spacers 132 may have a thickness sufficient to prevent or reduce leakage of charge from the active area 122 into a charge trapping layer. For example, the spacers 132 may have a width of about 100 Å or greater, and between about 100 Å and about 120 Å in some embodiments.

Figure 8:
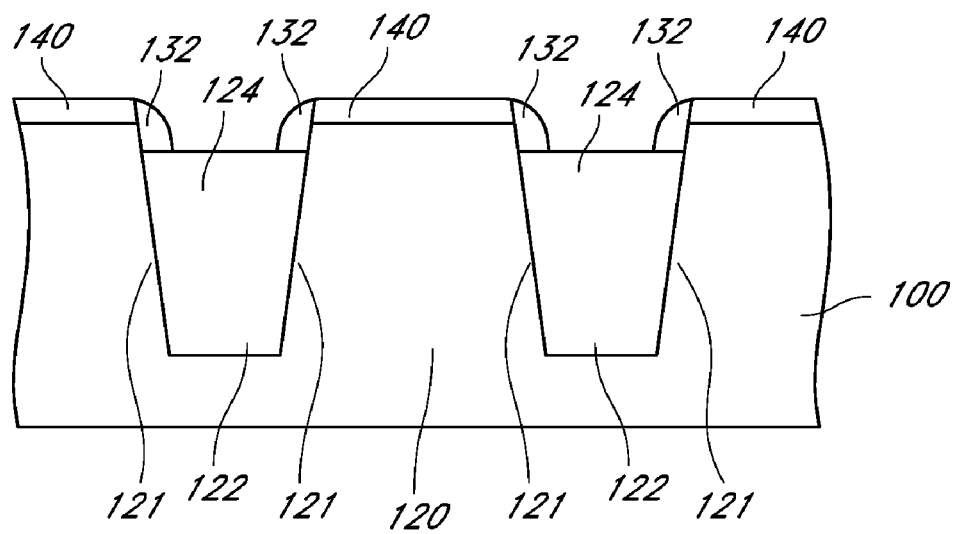
FIG. 8 illustrates a cross-sectional side view of the partially formed memory cell of FIG. 7 after removing sacrificial layers and forming an oxide in accordance with one or more embodiments of the present invention.

With continued reference to FIG. 1B, following step 32, the polysilicon layer 112 is removed in step 40 and the oxide layer 110 is removed in step 42. Following the removal of these sacrificial layers, which have served as etch stops and protective layers for the substrate 100 in earlier stages, step 44 shows forming dielectric material 140 which is part of the final structure of the memory device. Suitable dielectric materials 140 can include, without limitation, $SiO_2$, which can be grown thermally in a furnace with an oxidant-containing atmosphere, e.g., an $O_2$, $H_2O_2$ or atomic oxygen atmosphere. In some processes, dielectric materials 140 can also be exposed to a gas or plasma containing a nitrogen source such that a portion of the dielectric material 140 is "nitridized" to improve reliability or charge leakage performance. In some embodiments, the dielectric material can include a composite of $SiO_2$/SiN. SiN can also be present as a discrete layer in the stack forming the memory device. FIG. 8 illustrates a cross-sectional view of the memory cell after steps 40, 42, and 44 have been carried out. As noted above, in some processes, the final structural dielectric material may be used to protect the substrate during formation of the device in lieu of the sacrificial layers, thus obviating the need for steps 40, 42, and 44. Dielectric material 140 may be formed, for example, with a thickness that permits charge to tunnel through to the active area 120. For example, the thickness of the dielectric material 140 may be from about 55 Å and about 85 Å, more particularly between about 65 Å and about 75 Å.

Because the thickness of the finally formed dielectric material 140 may be less than the combined thicknesses of the oxide layer 110 and the polysilicon layer 112, the spacers 132 may need to be slightly recessed so that they do not protrude above the top surface of the dielectric material 140. However, a separate step may not need to be undertaken to recess the spacers 132, because, in some embodiments, recessing may be accomplished incidentally during the removal steps 40 and 42.

The spacers 132 may have a thickness that is substantially greater than the thickness of dielectric material 140, such that it is more difficult for electrons to pass through the spacers 132 than through the dielectric material 140. In this way, in the fully formed device, electrons may tunnel through the dielectric material 140 at the upper surface of the active area 120, but the spacers 132 prevent charge from leaking out of the sidewalls 121 of the active area 120. In some embodiments, the width of the spacers 132 is greater than about 110% of the thickness of the dielectric material 140, and may be between about 110% and about 200% of the thickness of the dielectric material 140, more particularly between about 130% and about 170%.

In one or more embodiments, the spacers 132 have an "effective thickness" that is substantially greater than the effective thickness of the dielectric material 140. Effective thickness, sometimes referred to as Effective Oxide thickness or EOT, takes account of the physical thickness of a dielectric material as well as its electrical insulating properties. Effective thickness is generally calculated relative to $SiO_2$ by using the dielectric constant of the material in question. For example, relative to $SiO_2$, in which E=3.9, the value for SiN is E=7. Accordingly, a layer of SiN that is 50 Å in thickness has an EOT=27.9. In some embodiments, the spacers 132 can have a dielectric constant that is greater than the dielectric material 140. Accordingly, in such embodiments, the spacers 132 may have a thickness that is less than the thickness of the dielectric material 140, and yet the spacers 132 may still have an effective thickness that is greater than the effective thickness of the dielectric material 140.

Figure 9:
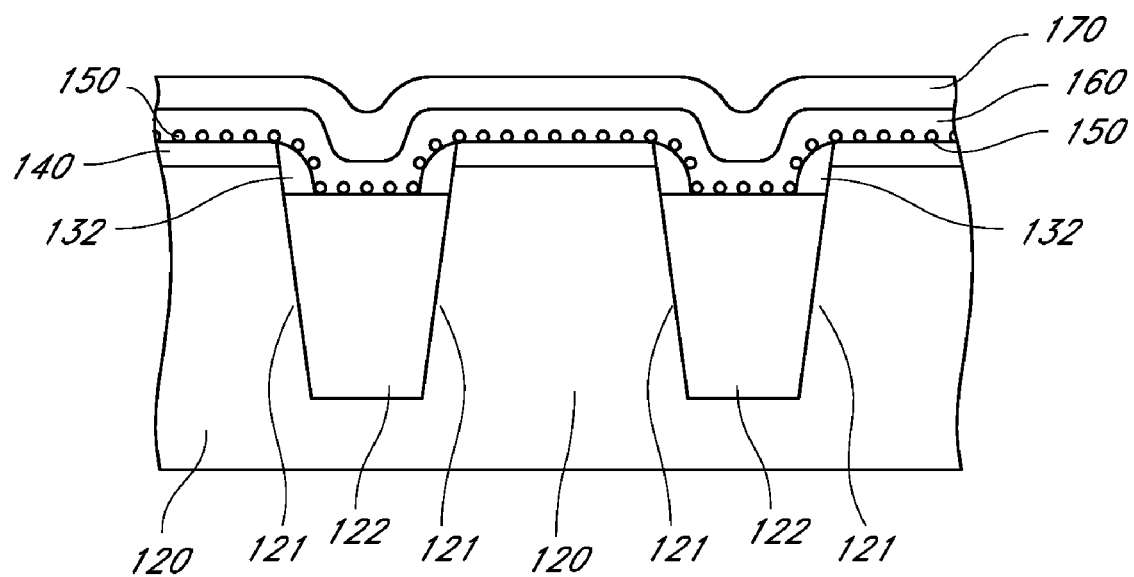
FIG. 9 illustrates a cross-sectional side view of the memory cell of FIG. 8 after forming a charge trapping layer, a dielectric, and a control gate in accordance with one or more embodiments of the present invention.

With continued reference to FIG. 1B, following step 44, a charge trapping structure 150 is formed in step 50. Charge trapping structure 150 may be formed of a layer of material capable of storing electrical charge or may include an embedded material capable of storing electrical charge. In the illustrated embodiment, the charge trapping structure 150 includes a plurality of embedded nanodots which may be formed separately from the remainder of the charge trapping layer 150, as known in the art. In some embodiments, nanodots can be formed of metals or metal nitrides such as Pt, Ru, W, or WN. In other embodiments, nanodots can be formed from discrete islands of polysilicon. A charge trapping structure formed having nanodots may reduce the sensitivity of the device to incidental defects in the underlying dielectric material 140 or the spacers 132. For example, if the charge trapping layer were formed of a monolithic floating gate, a defect in the dielectric material that allowed communication of the charge trapping structure with the active area could permit the charge trapping structure to lose all of its charge to the active area. In contrast, when the charge trapping structure 150 is formed of a plurality of nanodots, a defect in the dielectric material 140 may permit a nanodot immediately adjacent the defect to lose its charges, but other nanodots in the charge trapping structure 150 should still retain their charge. Nanodots may be formed of silicon or various metals or metal nitrides, for example, through processes such as chemical vapor deposition:

With continued reference to FIG. 1B, following step 50, a dielectric material 160 is formed in step 60 and a control gate 170 is formed in step 70. In some embodiments, the control gate 170 can be formed of Si, $WSi_x$, $TaSi_x$, or $NiSi_x$. FIG. 9 illustrates a cross-sectional view of the memory cell after steps 60 and 70 have been carried out. In accordance with known systems for flash memory devices, the control gate 170 and the dielectric material 160 are configured such that the control gate 170 may selectively store and remove charge in the charge trapping structure 150 through the dielectric material 160.

In accordance with the embodiments described above, a method is provided. Such a method might include, for example, blanket depositing a layer of dielectric material over a semiconductor material, wherein the semiconductor material comprises an active area. The method can further include etching the layer of dielectric material to form a dielectric spacer adjacent a sidewall of the active area. The method can further include providing charge trapping material over a dielectric material provided over the active area.

In other embodiments, a method is provided. The method can include exposing a sidewall of a semiconductor material. The method can further include providing a spacer material on the sidewall. The method can further include providing a charge trapping material over a dielectric material provided over the semiconductor material, wherein a thickness of the dielectric material between the charge trapping material and an upper surface of the semiconductor material is less than a width of the spacer material on the sidewall.

In other embodiments, a memory device is provided. One such memory device includes an active area of a semiconductor. The device can further include a charge trapping material separated from the active area by dielectric material, wherein the dielectric material is configured such that electrons may tunnel through the dielectric material between an upper surface of the active area and the charge trapping material during operation of the memory device and electrons are substantially prevented from tunneling through the dielectric material between the charge trapping material and a sidewall of the active area during operation of the memory device.

It will be appreciated by those skilled in the art that various other omissions, additions, and modifications may be made to the methods and structures described above without departing from the scope of the invention. All such changes are intended to fall within the scope of the invention, as defined by the appended claims.

What is claimed is:

1. A method comprising:
    blanket depositing a layer of dielectric material over a semiconductor material, wherein the semiconductor material comprises an active area;
    etching the layer of dielectric material to form a dielectric spacer adjacent a sidewall of the active area; and
    providing charge trapping material over a dielectric material provided over the active area,
    wherein forming the spacer comprises providing a spacer adjacent the sidewall such that the charge trapping material is separated from the sidewall by a dimension that is greater than about 130% of a thickness of the dielectric material between the charge trapping material and an upper surface of the active area, and
    wherein a width of the spacer is between about 130% and about 170% of the thickness of the dielectric material between the charge trapping material and an upper surface of the active area.

2. The method of claim 1, wherein providing a charge trapping material comprises forming a plurality of nanodots.

3. A method comprising:
    blanket depositing a layer of dielectric material over a semiconductor material, wherein the semiconductor material comprises an active area;
    etching the layer of dielectric material to form a dielectric spacer adjacent a sidewall of the active area; and
    providing charge trapping material over a dielectric material provided over the active area,
    wherein forming the spacer comprises forming the spacer such that the charge trapping material is separated from the sidewall of the active area by between about 100 Å and about 120 Å.

4. A method comprising:
    providing a dielectric spacer adjacent a sidewall of an active area of a semiconductor material;
    providing a charge trapping material over a dielectric material provided over the active area; and
    providing a control gate over the active area, the control gate being separated from the active area by at least the dielectric material and the charge trapping material,
    wherein providing the dielectric spacer comprises forming the spacer such that a separation between the charge trapping material and the sidewall of the active area is between about 110% and about 200% of a thickness of the dielectric material between an upper surface of the active area and the charge trapping material.

5. The method of claim 4, wherein providing the dielectric spacer comprises forming the spacer such that the separation is between about 130% and about 170% a thickness of the dielectric material between the upper surface of the active area and the charge trapping material.

6. The method of claim 4, wherein providing the dielectric spacer comprises forming the spacer such that the charge trapping material is separated from the sidewall of the active area by about 100 Å or greater.

7. The method of claim 4, wherein forming the spacer comprises forming the spacer such that the charge trapping material is separated from the sidewall of the active area by a distance in a range between about 100 Å and about 120 Å.

8. The method of claim 4, wherein the sidewalls have a height of between about 1800 Å and about 2200 Å.

9. The method of claim 4, wherein the active area has a width of between about 325 Å and about 425 Å.

10. The method of claim 4, wherein providing a charge trapping material comprises forming a plurality of nanodots.

* * * * *